United States Patent [19]
Nakanishi et al.

[11] Patent Number: 5,815,919
[45] Date of Patent: Oct. 6, 1998

[54] PROCESS FOR PRODUCING AN INTERCONNECT STRUCTURE ON A PRINTED-WIRING BOARD

[75] Inventors: Tohru Nakanishi; Hideo Ohkuma, both of Shiga-ken, Japan

[73] Assignee: International Business Machines Corporation, Armonk, N.Y.

[21] Appl. No.: 511,056

[22] Filed: Aug. 3, 1995

[30] Foreign Application Priority Data

Aug. 3, 1994 [JP] Japan .................................. 6-182395

[51] Int. Cl.$^6$ ...................................................... H05K 3/34
[52] U.S. Cl. .......................................... 29/840; 228/180.1
[58] Field of Search ........................... 29/840; 228/180.1, 228/180.21

[56] References Cited

FOREIGN PATENT DOCUMENTS

| | | | |
|---|---|---|---|
| 557081 | 8/1993 | European Pat. Off. .................. | 29/840 |
| 2487153 | 7/1991 | France . | |
| 1251788 | 10/1989 | Japan . | |
| 2-69992 | 3/1990 | Japan .................................. | 228/180.1 |
| 3-062599 | 3/1991 | Japan . | |
| 4-148587 | 5/1992 | Japan ........................................ | 29/840 |
| 4-336490 | 11/1992 | Japan ........................................ | 29/840 |
| 5-152734 | 6/1993 | Japan ........................................ | 29/840 |
| 6-53643 | 2/1994 | Japan ........................................ | 29/840 |
| 6-61632 | 3/1994 | Japan ........................................ | 29/840 |
| 2258183 | 2/1993 | United Kingdom . | |

OTHER PUBLICATIONS

IBM Tech. Disclosure Bulletin vol. 27, No. 48 Sep. 1984, pp. 2609–2610 "Enhanced Printed Circuit Board Design".

*Primary Examiner*—Carl J. Arbes
*Attorney, Agent, or Firm*—Whitham, Curtis, Whitham & McGinn; Arthur J. Samodovitz

[57] ABSTRACT

To prevent solder bridges that will easily occur in soldering an element whose leads are narrow in spacing. In a solder resist, there is provided an excess-solder absorbing region in which solder resist is not provided, between an end of a solder pad and the distal end of a lead. When a great deal of solder paste is applied to the solder pad for soldering the lead, an excess of solder melted due to the heat of a heater, flows along the lead and into the excess-solder absorbing region toward the distal end of the lead. Since the excess of solder does not flow across the solder resist provided between the leads, no solder bridge is formed.

10 Claims, 12 Drawing Sheets

PROCESS FOR PRODUCING AN INTERCONNECT STRUCTURE ON A PRINTED-WIRING BOARD

FIELD OF THE INVENTION

The present invention relates to printed-wiring boards and mounting structures and, more particularly, to preventing solder bridges on such boards that tend to form when the spacing of the leads of a surface-mounted element is narrow. The invention also relates to mounting structures which are capable of preventing solder bridges that tend to form when leads are repaired with solder.

BACKGROUND

As seen from the expansion in the market for notebook personal computers, the high-density integration of components has accelerated in recent years. Mounting boards are no exception. How components are mounted in a narrow space and how reliability is maintained are becoming very important considerations.

As the spacing between leads of an element becomes narrower as is recently the trend, the formation of solder bridges has become easier and yield is sometimes reduced because of the labor required for repairing solder bridges.

It is certain that such high-density integration of components will continue from now on and will be further accelerated. In other words, it may safely be said that the occurrence of solder bridges is becoming easier and easier.

Note that various methods for preventing solder bridges have been proposed. In a printed-wiring board disclosed in Japanese published utility patent application no. 5-291735, in order to prevent solder bridges, a solder resist is provided between lands, and on that solder resist there is provided another solder resist, and this way the height is increased by forming the solder resists in two layers. This method, however, has the disadvantage that the number of steps for forming solder resist is increased and therefore the cost is increased.

In a printed-wiring board disclosed in Japanese published utility patent application no. 60-143690, one solder resist covers a circuit for wiring and another solder resist is provided between the wiring circuit and a pad for surface-mounting. However, in this printed-wiring board, the height of the pad for surface-mounting and the height of the solder resist are the same and, when there is excess melted solder, there is a high possibility that solder bridges will occur.

In a printed-wiring board disclosed in Japanese published utility patent application no. 60-143690, lands are provided on the sides of foot patterns, and resists are provided around the foot patterns so that they are formed on the lands. Therefore, on the upper surfaces of the lands there are formed resist layers (banks) higher than the foot patterns, and solder bridges are prevented by this resist layer. However, the resist layers higher than the foot patterns are noncontinuous and, when there is an excess of melted solder, there is the possibility that the melted solder flows between the banks and causes solder bridges.

In a printed-wiring board disclosed in Japanese published utility patent application no. 59-148388, an ultraviolet-hardened solder resist is provided around a land of an element to which solder is applied, to prevent solder bridges. However, in this printed-wiring board, the height of the solder resist is lower than that of the land and, when there is an excess of melted solder, there is a high possibility that solder bridges will occur.

In a printed-wiring board disclosed in Japanese published utility patent application no. 4-359590, a photo-hardened photosolder resist is applied to a circuit board, small spaces between conductive patterns are collectively covered with an opaque mask film, and the photosolder resist of the opaque portion is exposure hardened by the transmission of light being transmitted through and scattered light. However, the height of the photosolder resist is lower than that of the conductive pattern and, when there is excess melted solder, there is a high possibility that solder bridges will occur.

In a printed-wiring board disclosed in Japanese published utility patent application no. 2-183595, a solder pad or an opening of a solder resist is formed into a wedge shape to prevent solder bridges. However, when there is excess melted solder, there is a high possibility that the melted solder will flow across the solder resist between the solder pads and cause solder bridges.

In a printed-wiring board disclosed in Japanese published utility patent application no. 62-74365, in order to prevent solder bridges, a solder resist is provided between lead patterns, insulation coating is printed on the solder resist, and a solder dam with a high surface is formed. This method, however, has the disadvantage in that the number of steps for printing insulation coating is increased, so the cost is increased.

In a printed-wiring board disclosed in Japanese published utility patent application no. 1-162279, in order to prevent solder bridges, a solder resist is provided between lead patterns, insulation coating is printed on the solder resist, and a solder barrier is formed. This method, however, has the disadvantage that the number of steps for printing insulation coating is increased, so the cost is increased.

In a printed-wiring board disclosed in Japanese published utility patent application no. 2-89878, a solder resist is formed on a circuit board having a plurality of solder pads, and the solder resist covers the edge of each pad and has a plurality of windows through which the centers of the pads are exposed. However, when there is an excess of solder melted, there is a high possibility that the melted solder will flow across the solder resist between the pads and causes solder bridges to occur.

In view of the foregoing, it is an object of the present invention to provide a printed-wiring board which is capable of preventing the solder bridges that will easily occur in soldering an element in which the spacing of the leads is narrow, without increasing the number of manufacturing steps, and a mounting structure which is capable of preventing solder bridges that will occur when leads are repaired with solder.

SUMMARY OF THE INVENTION

The invention is a printed-wiring board for mounting an element having a plurality of long leads and comprises: a circuit board; a plurality of solder pads for placing and soldering the leads which is provided on the circuit board; a solder resist for preventing the bonding of melted solder which is provided on at least a portion on the circuit board between the solder pads and is also provided on a predetermined portion on the circuit board excluding the solder pads; and an excess-solder absorbing region which is provided on the opposite side of the solder pad on the circuit board to the element and in which no solder resist is provided so that an excess of melted solder produced in soldering can escape from the solder pads and the leads.

In one preferred embodiment of the invention, the remaining portion of an opening of the solder resist excluding the solder pad is sized so that it can absorb the excess of melted solder, and the opening includes the excess-solder absorbing region and the solder pad is exposed through the opening.

In a further preferred embodiment of the invention, when the lead is placed on a predetermined position of the solder pad, the excess-solder absorbing region is opposed to the distal end side of the lead more than to the solder pad.

In an even further preferred embodiment of the invention, a length of the excess-solder absorbing region measured from its one end remote from the element to one end of the solder pad remote from the element is greater than an allowable error dimension of printing registration of the solder resist added to a length of a portion of the lead extending from the solder pad to one end of the lead remote from the element as the lead is placed on the predetermined position of the solder pad.

In yet another preferred embodiment of the invention, the element is surface-mounted by soldering the leads of the element to the solder pads of the printed-wiring board.

In the printed-wiring board of the invention, a predetermined amount of solder paste is applied to a plurality of solder pads by screen printing, etc. Next, an element having a plurality of long leads is disposed in a predetermined position of the printed-wiring board so that each lead is opposed to each solder pad. In this state, by pressing the plurality of leads at the same time by a heater, solder is melted and the leads are soldered to the solder pads.

When there inadvertently is is a great deal of solder paste applied, an excess of melted solder is generated due to the pressing of the heater, but this excess of melted solder flows along the lead (mainly the lower surface) into the excess-solder absorbing region provided on the side of the solder pad remote from the element. Therefore, solder bridges that will be caused by an excess of solder can be prevented with reliability.

In the printed-wiring board of this invention having the solder resist opening sized to absorb excess melted solder since the remaining portion of an opening of the solder resist excluding the solder pad is sized so that it can absorb the excess of melted solder, the excess of melted solder can be absorbed by the remaining portion. The opening includes the excess-solder absorbing region and the solder pad is exposed through the opening.

In the printed-wiring board of this invention having the excess-solder absorbing region opposed more to the distal end side of the lead solder than to the solder pad, the distal end of the lead projecting from the solder pad is opposed to the excess-solder absorbing region. For this reason, when the lead is pressed from above toward the solder pad by the heater, the lower surface of the distal end of the lead can be prevented from contacting the solder resist. For this reason, there is no possibility that the lead is bent backward and the distal end of the lead is lifted up from the printed-wiring board.

In the printed-wiring board of this invention having the length of the excess-solder absorbing region greater than an allowable error dimension of printing registration of the solder resist added to the length of an extending portion of the lead even if there occurred an error in position between the solder pad and the solder resist to be printed, the lower surface of the distal end of the lead would not contact the solder resist, because the length of the excess-solder absorbing region measured from its one end remote from the element to one end of the solder pad remote from the element is greater than an allowable error dimension of printing registration of the solder resist added to a length of a portion of the lead extending from the solder pad to one end of the lead remote from the element as the lead is placed on the predetermined position of the solder pad.

In the mounting structure of this invention having the element surface-mounted by soldering of its leads to the printed-wiring board solder pads excess-solder, since the element is surface-mounted by soldering the lead to the solder pad adjacent to the excess-solder absorbing region, an excess of melted solder produced in the solder repair of the lead is absorbed by the excess-solder absorbing region and therefore solder bridges can be prevented.

Figure 1:
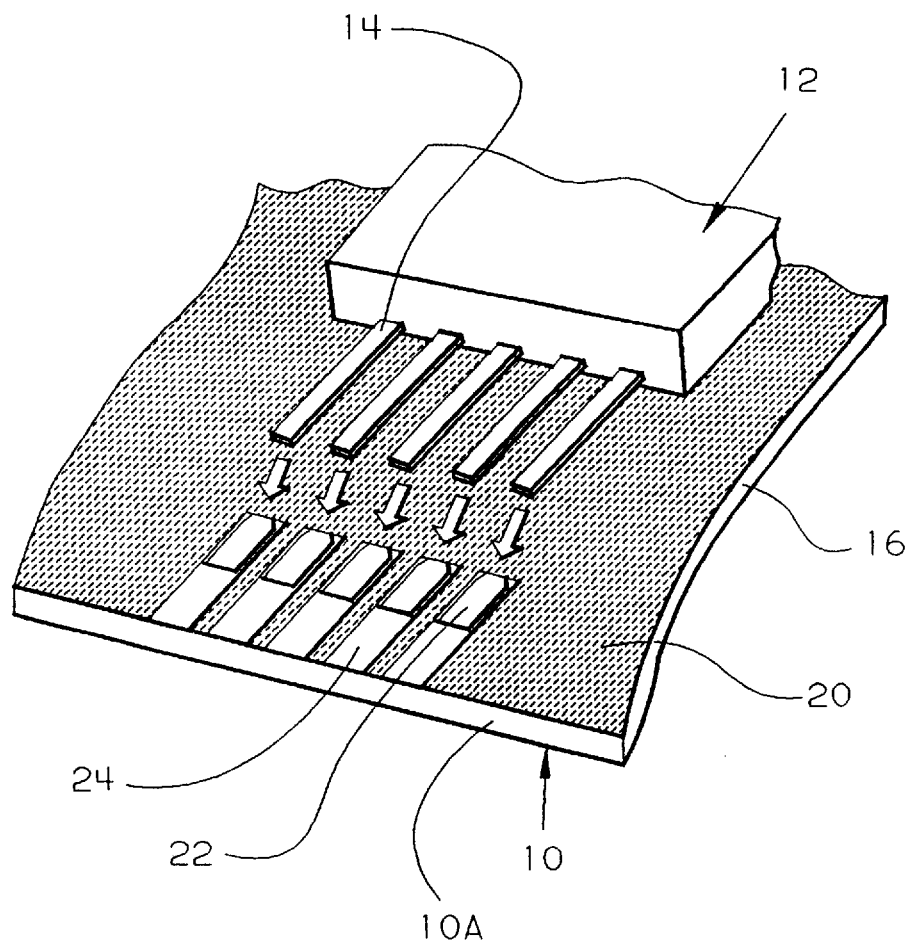
FIG. 1 is a perspective view of a printed-wiring board and an element of a first embodiment of the present invention before soldering.

DESCRIPTION OF LABELS IN THE DRAWINGS 10 printed-wiring board
12 element
14 lead
16 circuit board
20 solder resist
22 solder pad
24 excess-solder absorbing region

DETAILED DESCRIPTION OF THE INVENTION

Figure 6:
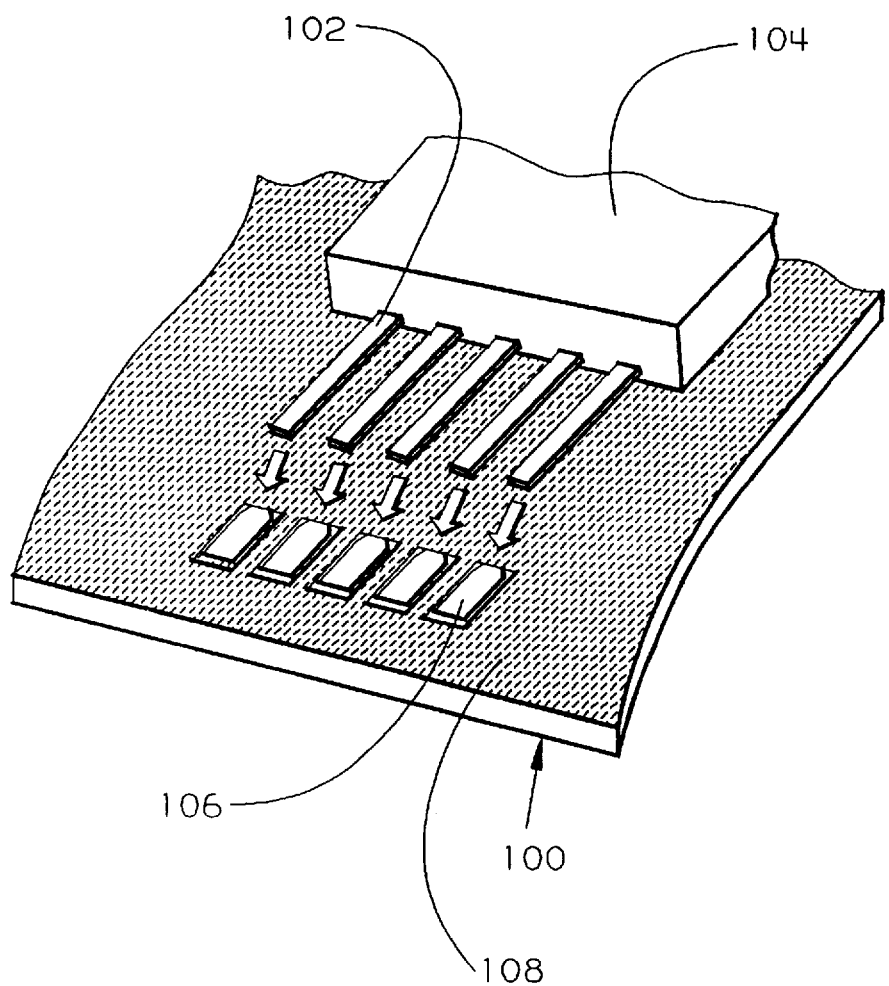
FIG. 6 is a perspective view of a printed-wiring board and element before soldering.

To surface-mount an element 104 (e.g., an LSI chip) having a plurality of leads 102 using solder, a plurality of solder pads 106 are arranged on a printed-wiring board 100 at predetermined intervals corresponding to leads 102, as shown in FIG. 6. To avoid electrical contact between adjacent leads 102 through solder bridges when soldering multiple-lead element 104, solder resist (portion shaded using dotted lines) 108 is provided around solder pads 106, as is generally known.

Figure 7:
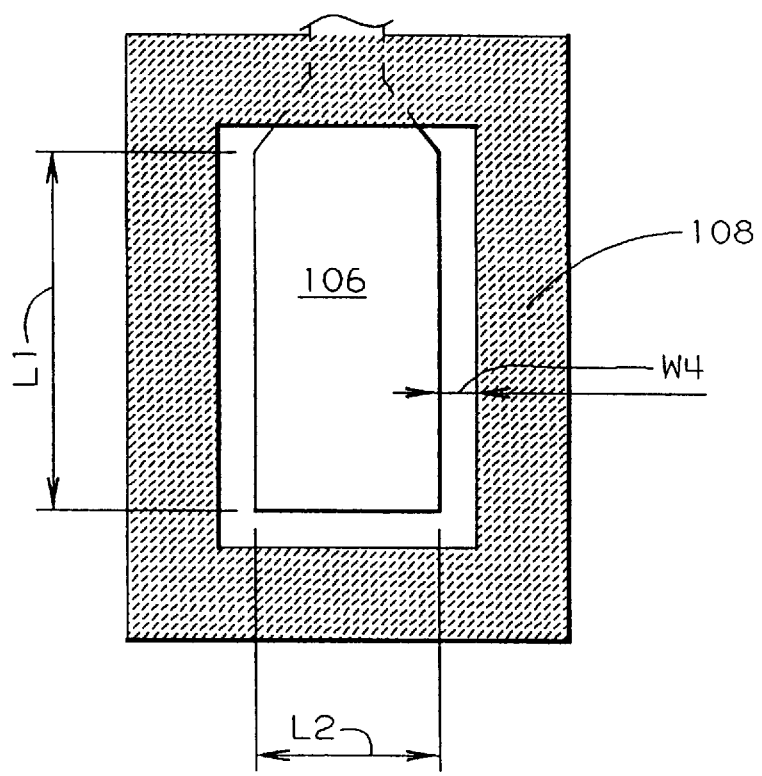
FIG. 7 is an enlarged view of the solder pad of the printed-wiring board of FIG. 6.

For example, as shown in FIG. 7, the size of solder pad 106 for soldering lead 102 (having a width of 0.3 mm and a thickness of 0.15 mm) is 1.0 mm in dimension L1 in the longitudinal direction of lead 102 and 0.35 mm in dimension L2 in the width direction.

A gap is also provided between solder pad 106 and solder resist 108 which defines the opening in solder resist 108. Width W4 of this gap is about 50 $\mu$m. The gap provides for positional tolerance between the opening of solder resist 108 and solder pad 106.

Figure 8:
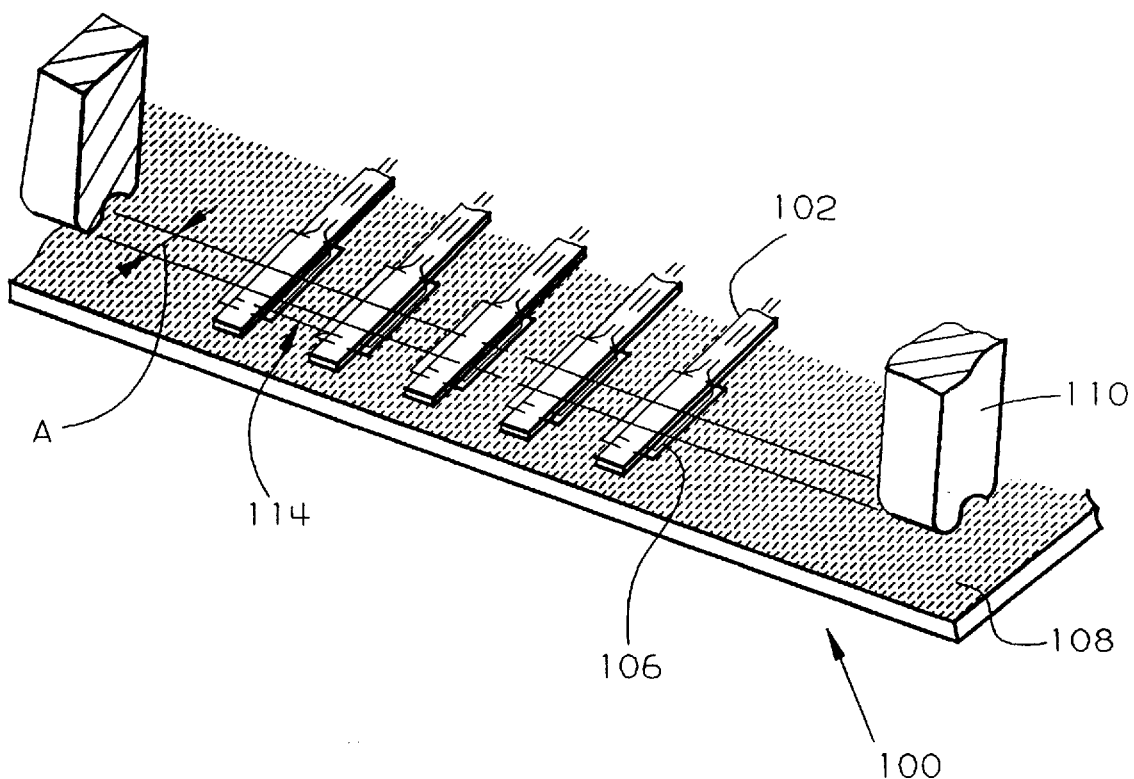
FIG. 8 is a perspective view showing the soder heater and a resulting solder bridge formed in printed-wiring board of FIG. 6.
Figure 9:
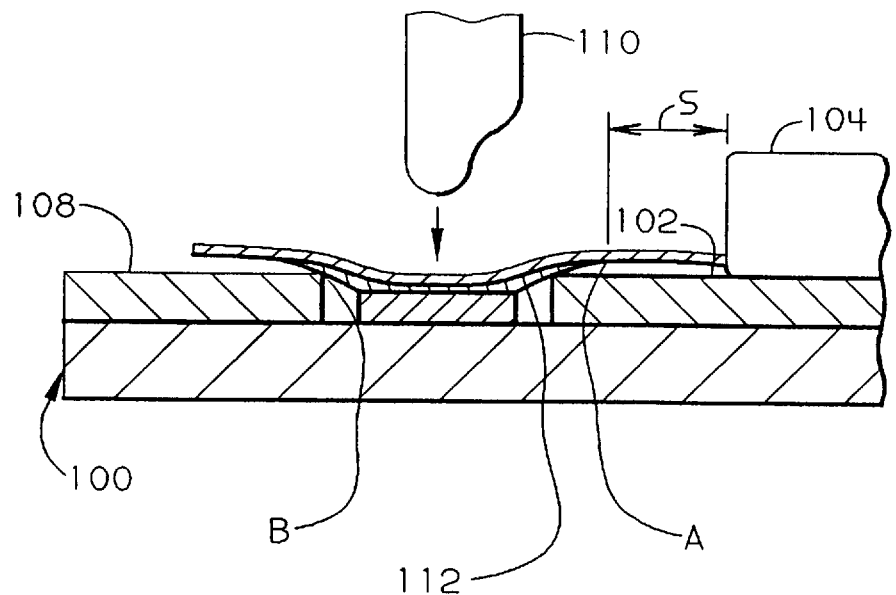
FIG. 9 is a sectional view of a pad of FIG. 8 taken in the longitudinal direction of a lead showing the soldered state as the center of a solder pad was pressed by a heater.
Figure 10:
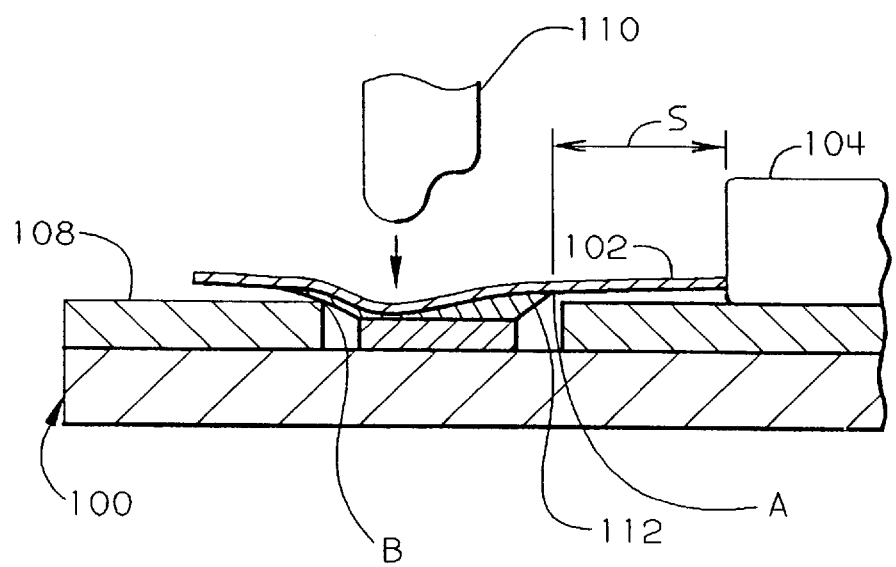
FIG. 10 is a sectional view of the pad of FIG. 8 taken in the longitudinal direction of the lead showing the soldered state as the portion of the solder pad closer to the distal end of the lead than to the center was pressed by a heater.

In soldering such elements 104, solder paste is applied to solder pads 106 of printed-wiring board 100 by screen printing, or another process. Leads 102 are placed on the solder paste on the pads and heater 110 extending in the direction of the arrangement of leads 102, is pressed onto leads 102. A plurality of leads 102 are soldered at the same time as shown in FIG. 8. At this point, when heater 110 presses the center of solder pad 106, as shown in FIG. 9, solder fillet 112 is formed with a symmetrical shape with respect to solder pad 106 in the longitudinal direction of lead 102, but when heater 110 presses one end of solder pad 106 remote from element 104, as shown in FIG. 10, solder fillet 112 is not a symmetrical shape in the longitudinal direction of lead 102.

In general, the position at which heater 110 is applied to lead 102 is preferably a position as far away as possible from element 104 to make the thermal and mechanical influence on element 104 as small as possible and to maintain the flexibility of lead 102 after soldering. That is, for the flexibility of lead 102 to be maintained, if the outer end of solder fillet 112 is assumed to be fulcrum A, dimension S from fulcrum A to element 104 is preferably longer (FIGS. 9 and 10). Therefore, for the shape of solder fillet 112, the asymmetrical shape shown in FIG. 10 is preferable to that shown in FIG. 9, and the position at which heater 110 is applied to lead 102 is normally a position more remote from element 104 than from the center of solder pad 106, as shown FIG. 10.

Incidentally, when solder paste is applied by screen printing, the errors of the thickness of the solder paste are about plus or minus 50% or so. As shown in FIG. 7, even if the center of solder pad 106 and the opening of solder resist 108 were aligned with each other (even if the positional relationship were the center of the standard), solder bridge 114 is sometimes formed when excess solder is applied, as shown in FIG. 8. This bridge is normally formed on a side more remote from element 104 of solder pad 106 than from the position of heater 110. Solder resist 108 is also normally formed by screen printing, so a fluctuation in the thickness is great and an error in the position of the printing also occurs.

Figure 11:
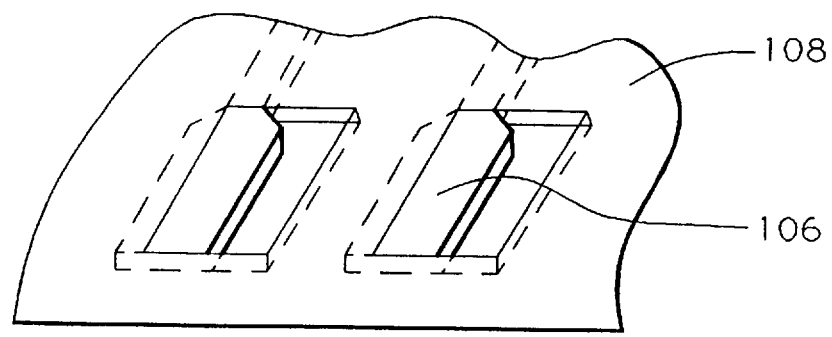
FIG. 11 is a perspective view of the vicinity of the solder pad of FIG. 8 showing the state in which there is an error in position between the solder pad and the solder resist.
Figure 12:
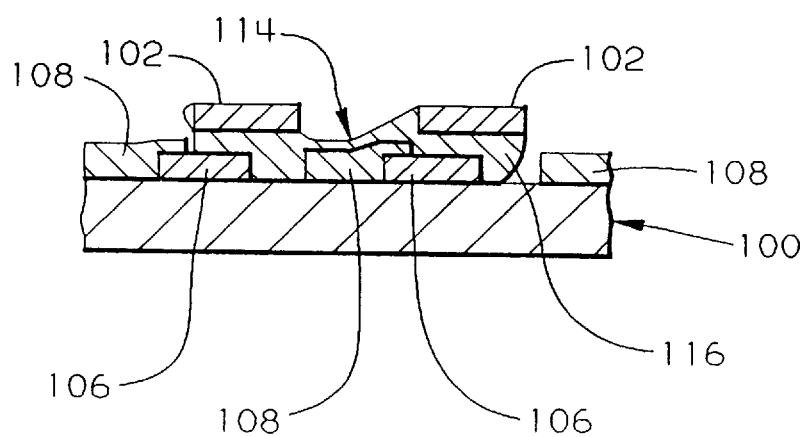
FIG. 12 is a sectional view of FIG. 8 taken in the width direction of the lead showing the state in which a solder bridge occurred as the lead was soldered to the solder pad shown in FIG. 11.

If an error has occurred in position between solder pad 106 and solder resist 108 (but, this error in position is within the standard), as shown in FIG. 11, solder 116 melted flows to the side of an adjacent lead 102 and solder bridge 114 is easily formed, as shown in FIG. 12, even if the amount of solder applied were appropriate.

Also, if the thickness of solder resist 108 becomes thinner, melted solder will easily flow across solder resist 108 and formation of solder bridge 114 may result.

Further, if heater 110 is moved farther from element 104, the probability of forming solder bridge 114 will become higher. This is because, by moving heater 110 away from element 104, heater 110 is moved toward point B of solder resist 108, as shown in FIG. 10, and the lower surface of lead 102 contacts point B when lead 102 is pressed down by heater 110 and therefore excess solder melted is prevented from being bonded beyond point B (when the heater is pressed at a position not so close to point B, the melted solder can flow beyond point B along the lower surface of lead 102) and, consequently, the melted solder easily flows to the side of lead 102.

Also, when lead 102 is pressed down with heater 110, lead 102 bends backward because of the repulsion of corner B of solder resist 108, and the distal end of lead 102 is lifted up from printed-wiring board 100 (FIG. 10). The bending of lead 102 becomes greater and greater, as the pressing position of heater 110 comes closer to the distal end of lead 102. When such bending of lead 102 became great, it is conceivable that the distal end of lead 102 will contact other components, when printed-wiring boards 100 are stacked or when printed-wiring board 100 comes closer to other components.

Embodiments of a printed-wiring board of the present invention will be described according to FIGS. 1 through 8.

First Embodiment

Figure 2:
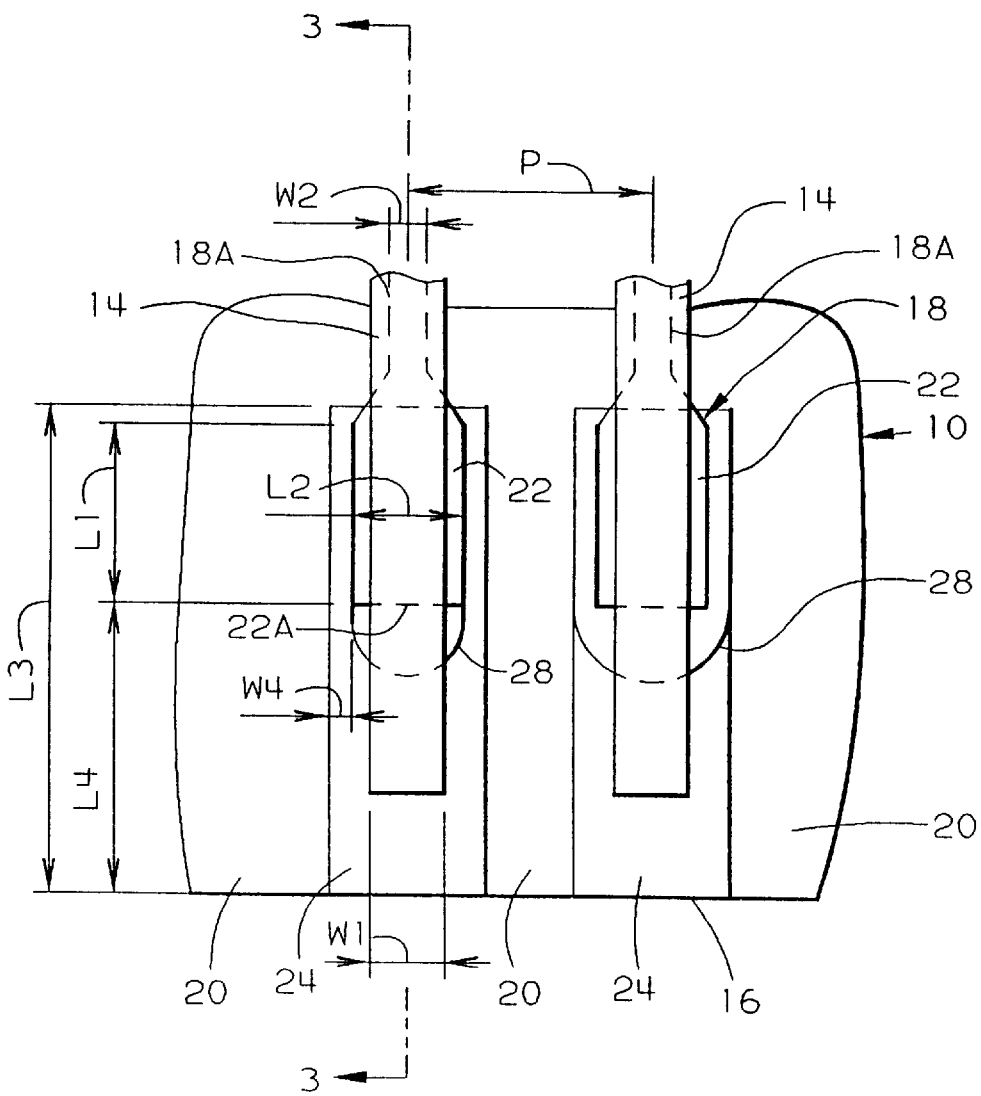
FIG. 2 is a plan view of the invention showing the leads of the element soldered on the solder pads.
Figure 3:
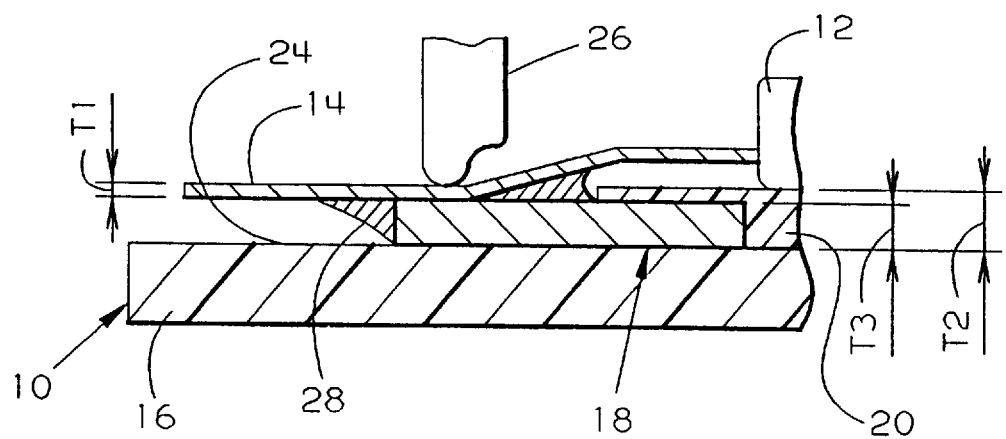
FIG. 3 is a longitudinal sectional view taken along line 3—3 of FIG. 2.

As shown in FIG. 1, plurality of leads 14 project from the side of element 12 (e.g., an LSI or IC chip) that will be mounted on printed-wiring board 10. As shown in FIGS. 2 and 3, in this embodiment, thickness t1 (FIG. 3) of lead 14 is 0.15 mm, width W1 (FIG. 2) is 0.3 mm, and pitch P (FIG. 2) is 0.6 mm.

Printed-wiring board 10 is formed on circuit board 16 with pattern 18 of a conductor, such as copper leaf (with a thickness 30 $\mu$m in this embodiment).

As shown in FIG. 2, solder pad 22 for soldering lead 14 is provided at a predetermined position in pattern 18. Solder pad 22 is a long rectangular shape in the longitudinal direction of lead 14 and, in this embodiment, longitudinal dimension L1 in a direction in the longitudinal direction of lead 14 is 1.0 mm and lateral dimension L2 in the width direction of lead is 0.35 mm. Width W2 of wiring portion 18A of pattern 18 is 0.1 mm in this embodiment.

Solder resist 20 is provided on circuit board 16 so that it covers a predetermined region excluding solder pad 22 of pattern 18. In this embodiment, thickness t2 (FIG. 3) of solder resist 20 is 30 to 40 $\mu$m.

As shown in FIGS. 1 and 2, a gap is provided between the longitudinal side and solder resist 20. This gap is provided for absorbing an error in position between solder pad 22 and solder resist 20 and, in this embodiment, width dimension W4 of the gap is set to 50 $\mu$m.

On the side of the distal end of lead 14 extending from end 22A of solder pad 22, there is provided an excess-solder absorbing region 24 in which solder resist 20 is not provided.

This excess-solder absorbing region 24 is greater than solder pad 22 by a predetermined dimension. For the size of the excess-solder absorbing region 24 of this embodiment, the width dimension (W4×2+L2) in a direction in the width direction of lead 14 is 0.45 mm and dimension L4 in a direction in the longitudinal direction of lead 14 is 0.5 mm.

The operation of this embodiment will next be described. First, a predetermined amount of solder paste (not shown) is applied to solder pad 22 of printed-wiring board 10 by screen printing.

Next, element 12 is positioned into a predetermined position on printed-wiring board 10 so that each lead 14 is opposed to solder pad 22.

Next, leads 14 are pressed from above at the same time with heater 26. Therefore, as shown in FIG. 3, lead 14 is bent downward by heater 26 and also the solder paste is melted. After 2 to 3 seconds, the electricity to heater 26 is stopped, cooling air is applied toward lead 14, and solder 28 is hardened, so solder pad 22 and lead 14 are connected (soldered). Thereafter, heater 26 is moved upward.

Since the distal end of lead 14 corresponds to the excess-solder absorbing portion 24 and the lower surface of lead 14 is by no means brought into contact with solder resist 20, there is no possibility that lead 14 is bent backward when pressed by heater 26 and the distal end of the lead is bent in a direction away from printed-wiring board 10. Therefore, the distal end of lead 14 does not contact, for example, any other component (not shown) over the printed-wiring board 10. Also, even if a great deal of solder paste were applied to solder pad 22, an excess of solder 28 melted due to the heat of heater 26 would flow along lead 14 and into the excess-solder absorbing region 24 toward the distal end of lead 14 (see right-hand lead 14 shown in FIG. 2, note that in left-hand lead 14 the amount of solder is almost an appropriate amount).

Therefore, there is no possibility that an excess of solder 28 melted rises above the surface of solder resist 20 and flows across solder resist 20 between leads 14 to form a so-called solder bridge.

For the size of excess-solder absorbing region 24, a conceivable maximum amount of solder paste is applied to solder pad 22, a lowest size at which solder bridges do not occur is measured by actually soldering before mass production, and then the size of region 24 is preferably to be set to a sufficient size greater than the area of the measured lowest size. Note that, as a rough criterion, the area of excess-solder absorbing region 24 {=L4×(W4×2+L2)} is preferably more than 50% of the area of solder pad 22. This is a rough criterion, however, so the area of excess-solder absorbing region 24 changes depending on how much excess solder is produced in the manufacturing process.

It is to be noted that, precisely speaking, the volume of a space that the volume of pattern 18 in the opening of solder resist 20 (almost equal to L1×L2×t3) is subtracted from the volume of the opening of solder resist 20 {=(W4×2+L2)× L3×t2}, is a volume that can absorb an excess of solder 28 with reliability.

Thus, in printed-wiring board 10 of this embodiment, even if there were a great deal of solder, solder bridges could be reliably prevented because an excess of solder melted can escape into excess-solder absorbing region 24. Also, even if pitch P between leads 14 becomes narrower in future, it is obvious that an occurrence of solder bridges can be prevented.

Note that a structure in which element 12 is soldered and mounted on printed-wiring board 10 is a mounting structure.

Alternately solder (paste) may be applied to solder pad 22 by electroplating and by electroless plating, but these methods require complicated equipment and are expensive, as compared to the screen printing method employed in this embodiment.

Second Embodiment

Figure 4:
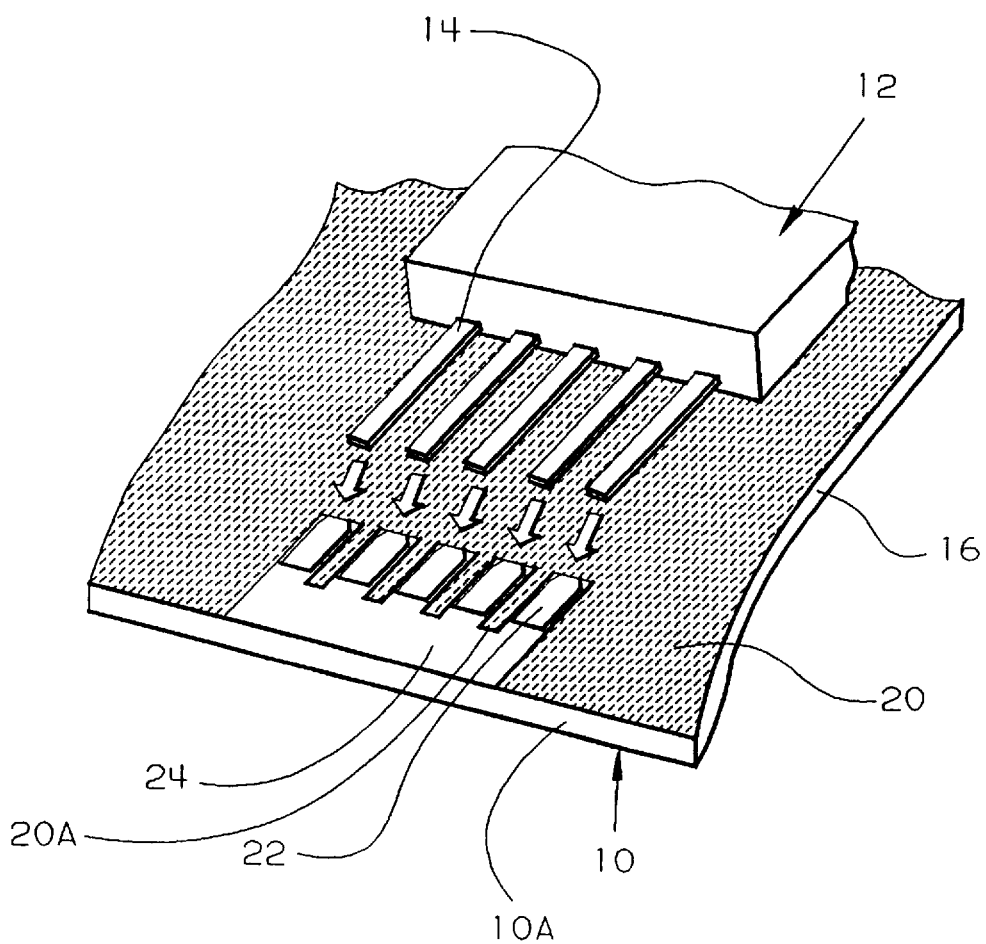
FIG. 4 is a perspective view of a printed-wiring board and an element of a second embodiment of the present invention before soldering.

A second embodiment of the present invention will be described according to FIG. 4. The same reference numerals will be applied to the same constitution as the first embodiment and therefore a description thereof will be omitted here.

In printed-wiring board 10 of this embodiment, solder resist 20 provided between leads 14 terminates short of an end 10A of printed-wiring board 10. As with the first embodiment, this embodiment also can prevent solder bridges.

It is to be noted that an end 20A of solder resist 20 provided between leads 14 is preferably positioned beyond at least solder pad 22 toward the distal end of lead 14. Also, end 20A of solder resist 20 is set after it has been proven by experiment that an excess of solder 28 melted does not contact end 20A.

Third Embodiment

Figure 5:
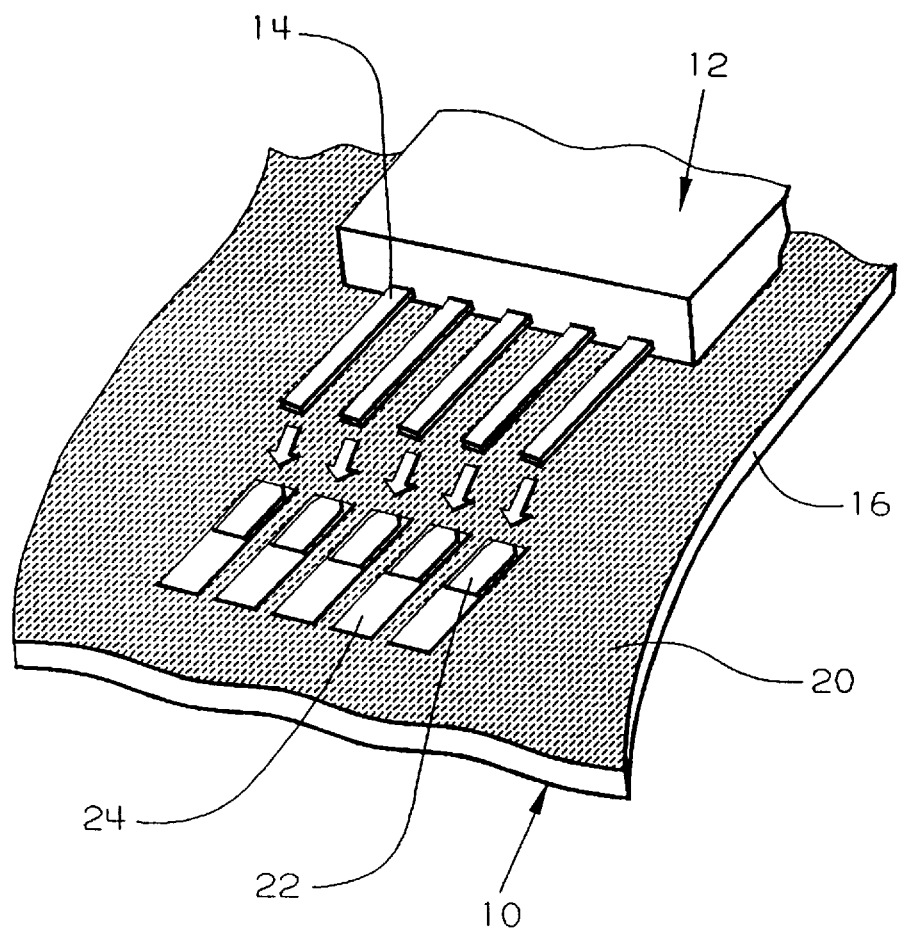
FIG. 5 is a perspective view of a printed-wiring board and an element of a third embodiment of the present invention before soldering.

A third embodiment of the present invention will be described according to FIG. 5. The same reference numerals will be applied to the same constitution as the first embodiment and therefore a description thereof will be omitted here.

In this embodiment, there is shown an example of a case where element 12 (not shown in FIG. 5) is disposed, for example, in the vicinity of the center of printed-wiring board 10.

This embodiment can also prevent solder bridges if, as a rough criterion, the area of an excess-solder absorbing region 24 is set to more than 50% of the area of solder pad 22. Note that this is a rough criterion, so the area of the excess-solder absorbing region 24 changes depending on how much excess solder is produced in the manufacturing process.

It is to be noted that solder resist 20 is printed on pattern 18 (see FIG. 2), so a positional error sometimes occurs between solder pad 22 and solder resist 20. The dimensions of excess-solder absorbing region 24 are preferably set so that, even if the maximum positional error within a standard occurs, lead 14 projecting from solder pad 22 would be opposed to excess-solder absorbing region 24 at all times.

In this embodiment, since the maximum error in position between solder pad 22 and solder resist 20 is assumed to be 0.1 mm, the dimensions of the excess-solder absorbing region 24 are preferable to be set in view of a dimension greater than 0.1 mm.

Fourth Embodiment

A fourth embodiment of the present invention will be described according to FIGS. 13 and 14. The same reference numerals will be applied to the same constitution as the first embodiment and therefore a description thereof will be omitted here.

Some of elements 12 are called a tape carrier package (TCP). When this type of element 12 is soldered, leads 14 of element 12 are easily damaged and deformed because they are very thin.

Figure 13:
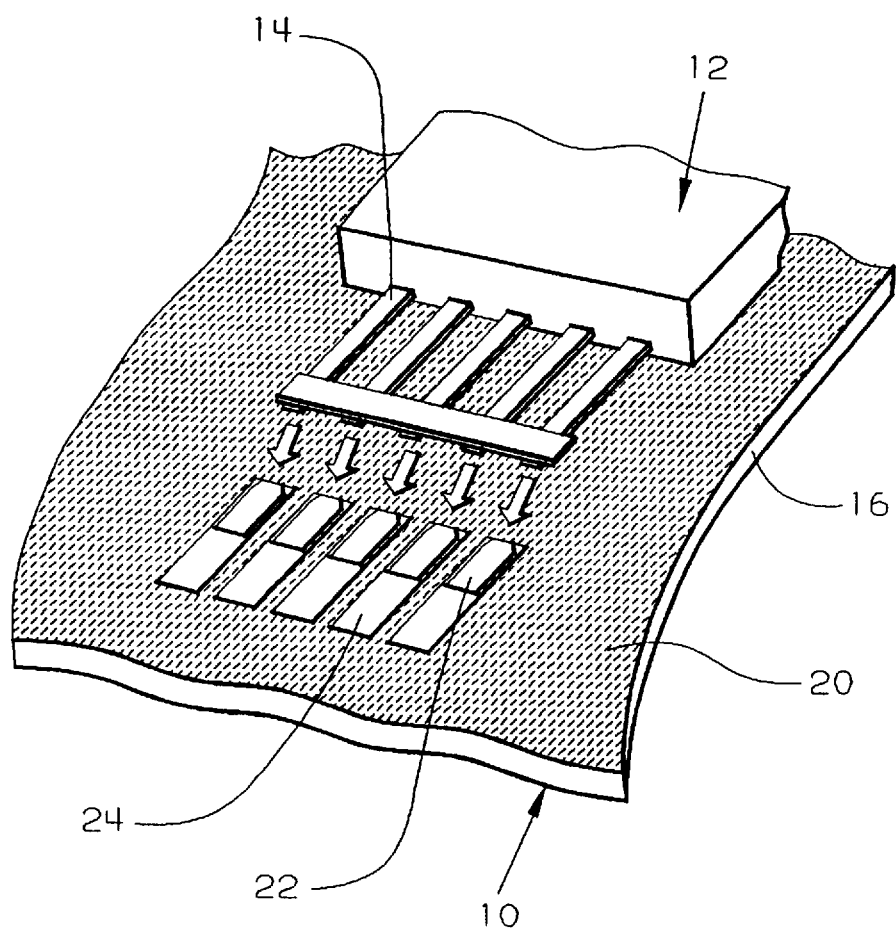
FIG. 13 is a perspective view showing a TCP element and a printed-wiring board of the invention.
Figure 14:
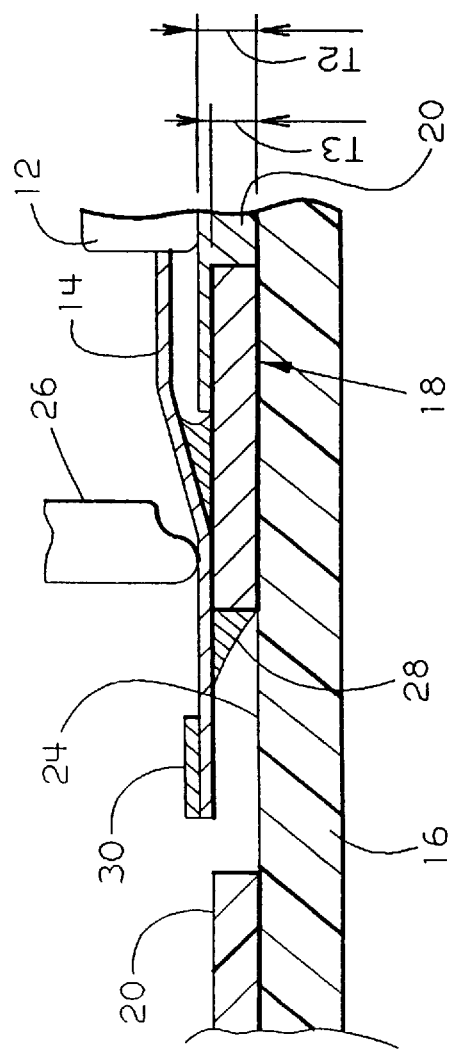
FIG. 14 is a sectional view taken in the longitudinal direction of the lead of FIG. 13 in the vicinity of the solder pad as the TCP element was soldered to the printed-wiring board.

For this reason, reinforcing tape 30 is attached to the distal ends of leads 14 to prevent the deformation of leads 14, as shown in FIG. 13.

This reinforcing tape 30 is normally made from a polyamide material, poor in heat conduction, and reduces the rate of heat conduction from heater 26 to solder, and not good for soldering, so it is as far as possible away from solder so that it does not contact heater 26.

In a conventional printed-wiring board of this kind, there was the problem that excess melted solder is blocked by the reinforcing tape and therefore flows to an adjacent lead along the reinforcing tape, so solder bridges are easily formed. However, since in printed-wiring board 10 of the present invention an excess of melted solder can flow into excess-solder absorbing region 24, solder bridges can be prevented even if reinforcing tape 30 were provided on leads 14.

It is to be noted that the relationship of dimensions in the above-described embodiment is merely an example. Needless to say, the dimensions of excess-solder absorbing region 24 can be changed according to the dimensions of lead 14 and solder pad 22.

Also, in a mounting structure in which an element is mounted on the printed-wiring board described in the above embodiments, soldering is sometimes performed again in the repair and replacement of elements. In this case, there is also the possibility that an excess of melted solder is produced when there is a great deal of solder. However, in such a case, solder bridges can also be prevented in element repairs because an excess of melted solder is absorbed by the excess-solder absorbing region.

As has been described hereinbefore, the printed-wiring board of this invention has the advantage that, even if there were an excess of solder, solder bridges could be prevented because melted solder can flow into the excess-solder absorbing region provided on the side of the solder pad remote from the element.

The printed-wiring board in a further embodiment of this invention also has the excellent advantage that all of an excess of melted solder can be absorbed by the remaining of an opening of the solder resist excluding the solder pad. The opening includes the excess-solder absorbing region and the solder pad is exposed through the opening.

The printed-wiring board in another embodiment of this invention also has the excellent advantage that the distal end of the lead can be prevented from being lifted up from the printed-wiring board when the lead is soldered by the heater, and also the distal end of the lead can be prevented from contacting other components, because the distal end of the lead projecting from the solder pad is opposed to the excess-solder absorbing region.

The printed-wiring board in yet another embodiment of this invention also has the excellent advantage that, even if there occurred an error in position between the solder pad and the solder resist to be printed, the distal end of the lead could be prevented from being lifted up from the printed-wiring board when the lead is soldered by the heater and also the distal end would not contact other components, because the length of the excess-solder absorbing region measured from its one end remote from the element to one end of the solder pad remote from the element is greater than the allowable error dimension of printing registration of the solder resist added to a length of a portion of the lead extending from the solder pad to one end of the lead remote from the element as the lead is placed on the predetermined position of the solder pad.

The mounting structure in another embodiment of this invention also has the excellent advantage that an excess of melted solder produced in the solder repair of the lead is absorbed by the excess-solder absorbing region and therefore solder bridges can be prevented because the element is surface-mounted by soldering the lead to the solder pad adjacent to the excess-solder absorbing region.

We claim:

1. A process for producing interconnect structures, comprising:

forming a substrate with a dielectric surface and an external surface wiring layer including rows of solder pads adjacent to respective component mounting sites, for connecting components;

depositing a layer or organic solder resist on the external surface extending between the pads in the rows; and providing windows in the resist which expose the soldering pads and define an excess solder region on the opposite side of the pad from the respecting mounting site in which region the solder resist is less thick than elsewhere on the surface and which region is wider than the gap between pads in the row, and providing excess solder regions that connect together along a row beyond the solder pad ends opposite from the mounting site.

2. The invention of claim 1 in which:

there is essentially no resist in the excess solder region; and providing windows includes providing a gap between the pad and the edge of the window, in which there is essentially no resist and which gap extends on each edge of the pad between pads in the row and which is narrower then the excess solder region.

3. The invention of claim 1 in which:

depositing solder resist includes depositing the resist on the surface thicker than the thickness of the solder pads; and the excess solder region is wider than any extension of the leads past the solder pad edges opposite from the mounting site, so that the ends of the leads do not rest on the solder resist.

4. The invention of claim 1 in which the solder resist is deposited between the rows of pads and between the rows and component sites.

5. The invention of claim 1 in which providing windows includes providing excess solder regions larger than about 50% of the area of the solder pads.

6. The invention of claim 1 in which the solder pads are formed with a spacing at about 0.3 mm or less between centers.

7. A process for producing circuit board assemblies, comprising:

forming a substrate with a dielectric surface and an external surface wiring layer including rows of solder pads adjacent to respective component mounting sites, for connecting components;

depositing a layer or organic solder resist on the external surface extending between the pads in the rows;

providing windows in the resist which expose the soldering pads and define an excess solder region on the opposite side of the pad from the respecting mounting site in which region the solder resist is less thick than elsewhere on the surface and which region is wider than the gap between pads in the row;

screening solder paste onto the pads;

mounting a component at the component mounting site with leads extending on the solder paste on the pads, wherein said component includes tape extending across the leads; and holding the lead down onto the pads while reflowing the solder to form a solder joint between the pad and lead.

8. The invention of claim 7 in which reflowing the solder includes pressing a hot bar against the leads in the rows to solder the leads to the pads.

9. The invention of claim 7 in which the component is mounted with the leads extending past the solder pad edges opposite from the mounting site and during reflowing the solder forms fillets between the bottoms of the leads and such opposite edges of the solder pads.

10. A process for producing circuit board assemblies, comprising:

forming a substrate with a dielectric surface and an external surface wiring layer including rows of solder pads adjacent to respective component mounting sites, for connecting components;

depositing a layer or organic solder resist on the external surface extending between the pads in the rows;

providing windows in the resist which expose the soldering pads and define an excess solder region on the opposite side of the pad from the respecting mounting site in which region the solder resist is less thick than elsewhere on the surface and which region is wider than the gap between pads in the row, and providing excess solder regions that connect together along a row beyond the solder pad ends opposite from the mounting site;

screening solder paste onto the pads;

mounting a component at the component mounting site with leads extending on the solder paste on the pads; and holding the lead down onto the pads while reflowing the solder to form a solder joint between the pad and lead.

* * * * *